(12) United States Patent
Tamura

(10) Patent No.: US 8,305,173 B2
(45) Date of Patent: Nov. 6, 2012

(54) SUPERCONDUCTIVE MAGNET

(75) Inventor: Hajime Tamura, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 285 days.

(21) Appl. No.: 12/576,350

(22) Filed: Oct. 9, 2009

(65) Prior Publication Data

US 2010/0295640 A1  Nov. 25, 2010

(30) Foreign Application Priority Data

May 20, 2009  (JP) .................................. 2009-122071

(51) Int. Cl.
  *H01F 6/00*  (2006.01)
  *H01F 7/00*  (2006.01)
(52) U.S. Cl. ............ 335/216; 335/301; 324/318; 29/599
(58) Field of Classification Search .................. 335/216, 335/217, 250, 282, 284, 296–300; 324/300, 324/307, 309, 318–322; 29/599, 602.1, 605, 29/606, 846, 847, 856, 858, 883; 427/96, 427/97, 116, 123, 124

See application file for complete search history.

(56) References Cited

U.S. PATENT DOCUMENTS

| | | | |
|---|---|---|---|
| 5,668,516 A * | 9/1997 | Xu et al. ........................ | 335/216 |
| 7,498,810 B2 * | 3/2009 | Lvovsky et al. .............. | 324/318 |
| 7,849,587 B2 * | 12/2010 | Calvert et al. .................. | 29/605 |
| 2005/0110602 A1 * | 5/2005 | Westphal ...................... | 335/301 |
| 2006/0218942 A1 * | 10/2006 | Atkins et al. .................. | 62/51.1 |
| 2006/0284711 A1 * | 12/2006 | Atkins et al. .................. | 335/216 |

FOREIGN PATENT DOCUMENTS

| | | |
|---|---|---|
| JP | 5-90022 A | 4/1993 |
| JP | 2001-99904 A | 4/2001 |
| JP | 2007-159741 A | 6/2007 |
| JP | 2007-189082 A | 7/2007 |
| JP | 2007-288193 A | 11/2007 |

OTHER PUBLICATIONS

Office Action from Chinese Patent Office issued in corresponding Chinese Patent Application No. 200910261570.5 dated Sep. 23, 2011, with a partial English translation thereof, 4 pages.

* cited by examiner

*Primary Examiner* — Bernard Rojas
(74) *Attorney, Agent, or Firm* — Buchanan Ingersoll & Rooney PC

(57) ABSTRACT

There is obtained a superconductive magnet in which there are reduced the machining costs and the amount of materials for bobbins and supporting members that support coils. In a superconductive magnet provided with a first group of coils serving as main coils for generating a magnetic field and a second group of coils serving as shield coils that are arranged coaxially with the first group of coils and generate a magnetic field whose direction is opposite the direction of a magnetic field generated by the first group of coils so that a magnetic field that leaks outside is cancelled, the second group of coils are arranged at axis-direction positions where axis-direction electromagnetic force generated by the first group of coils and exerted on the second group of coils and axis-direction electromagnetic force generated by the second group of coils balance with each other and cancel out each other.

10 Claims, 13 Drawing Sheets

SUPERCONDUCTIVE MAGNET

BACKGROUND OF THE INVENTION

1. Field of the Invention

The present invention relates to a superconductive magnet utilized mainly in a magnetic resonance imaging (MRI) system, a nuclear magnetic resonance (NMR) analysis system, a monocrystal pulling system, and the like.

2. Description of the Related Art

In an MRI system, an NMR analysis system, and a monocrystal pulling system, because measurement or production of a monocrystal requires a high magnetic field, a superconductive magnet is utilized.

FIG. 12 is a cross-sectional perspective view illustrating the structure for a conventional superconductive magnet. FIG. 13 is a cross-sectional plan view of the conventional superconductive magnet in FIG. 12. A superconductive magnet is required to generate a high magnetic field in a desired region (referred to as a magnetic-field generation region 1, hereinafter). Taking a MRI superconductive magnet as an example, it is required to generate a high magnetic field of, for example, 1.5 tesla in a space (e.g., a spherical space having a diameter of 50 cm in a magnetic cylinder) for obtaining a diagnostic image. On the other hand, it is required that a magnetic field that leaks outside the superconductive magnet is as small as possible. For example, in the case of a MRI superconductive magnet, it is required that a leakage magnetic field at each position that is 5 m apart from the magnet is smaller than 0.5 millitesla. This is because it is desirable that a leakage magnetic field is as small as possible in a region where the leakage magnetic field attracts a magnetic body or affects an electronic apparatus or the like.

Accordingly, in order to reduce a leakage magnetic field, a conventional superconductive magnet incorporates two kinds of superconductive coils, i.e., a main coil 2 for generating a desired magnetic field and a shield coil 3 for cancelling out a magnetic field that leaks outside the main coil 2. The shield coil 3 is a coil for generating a magnetic field that is opposite the magnetic field generated by means of the main coil 2; by disposing the shield coil 3 at an appropriate position, a leakage magnetic field can be cancelled out.

Hereinafter, letting the center of the magnetic-field generation region 1 be an origin, the axis-direction coordinate and the radial coordinate are referred to as the Z coordinate and the R coordinate, respectively. The main coil 2 and the shield coil 3 are each formed of a plurality of superconductive coils that are arranged coaxially with one another. In order to secure the performance of the superconductive magnet while suppressing the cost as much as possible, the positions and the sizes of the main coil 2 and the shield coil 3 are selected in such a way that the specifications of required magnetic-field intensity, magnetic-field homogeneity, and leakage-magnetic-field intensity are satisfied and the amount of superconductive wires, which are main materials of the coils, is minimized.

As a result, in general, the main coils 2 are arranged in such a way as to adhere to the inner-circumference surface, of the cylinder, where the R coordinate is small and which is nearest to the magnetic-field generation region 1; the shield coils 3 are arranged in such a way as to adhere to positions (in FIG. 13, the four corners of the inner region of the magnet) where the R coordinate and the Z coordinate are maximum and which are furthest from the magnetic-field generation region 1. Because being a coil having a reverse polarity, the shield coil 3 has an effect to cancel out the magnetic field in the magnetic-field generation region 1, by arranging the shield coils 3 in such a way as to be far from the magnetic-field generation region 1, the magnetic field can more effectively be generated. The foregoing arrangement has the highest efficiency in terms of the amount of used superconductive wires; thus, the amount of superconductive wires can be reduced.

The main coil 2 and the shield coil 3 are each held in such a way as to be wound around a main bobbin 21 and a shield bobbin 31, respectively. The shield bobbin 31 is supported by the shield bobbin supporting member 32 in such a way as to be coupled with the main bobbin 21. In order to make the magnet generate a desired high magnetic field, it is required to apply a large current of several hundreds amperes to the superconductive coil. As a result, a high magnetic field is generated in the vicinity of each of the superconductive coils; therefore, large electromagnetic force is exerted on the superconductive coil. When the electromagnetic force makes the superconductive coil move or bend, heat is produced in the outer surface or the inside of the coil; this heat may cause a so-called quench phenomenon in which the superconductive state is destructed and transits to a normal conductive state. In a conventional superconductive magnet, in order to prevent the quench phenomenon, the main bobbin 21, the shield bobbin 31, and the shield bobbin supporting member 32 are formed of a thick material or formed in a rigidly coupled structure so that the electromagnetic force is suppressed from moving or bending the superconductive coil. Additionally, the shield bobbin 31 is formed of a cylinder integrated with the magnet approximately over the whole length thereof, in order to raise the rigidity of the shield bobbin 31. In addition, Japanese Patent Application Laid-Open No. 2007-288193 typifies the reference patent documents in the technical field to which the present invention belongs.

In recent years, the intensity of the magnetic field generated in a superconductive magnet has been raised, and it tends to be required that the system per se is compact. As a result, the intensity of the magnetic field in the vicinity of the superconductive coil has also been raised, and the electromagnetic force has also become large. In the conventional technology, by forming the main bobbin 21, the shield bobbin 31, and the shield bobbin supporting member 32 in a more rigid structure, a structure that can withstand electromagnetic force has been realized; however, there has been a problem that, the amount of materials utilized in the bobbins and the supporting structure increases as the electromagnetic force of a superconductive magnet is enlarged lately, and hence the weight and the costs in production, cooling, and transportation increase.

SUMMARY OF THE INVENTION

The present invention has been implemented in order to solve the foregoing problems; the objective thereof is to provide a superconductive magnet in which there are reduced the machining costs and the amount of materials for bobbins and supporting members that support coils.

A superconductive magnet according to the present invention is provided with a first group of coils serving as main coils for generating a magnetic field and a second group of coils serving as shield coils that are arranged coaxially with the first group of coils and generate a magnetic field whose direction is opposite the direction of a magnetic field generated by the first group of coils so that a magnetic field that leaks outside is cancelled; the second group of coils are arranged at axis-direction positions where axis-direction electromagnetic force generated by the first group of coils and exerted on the second group of coils and axis-direction electromagnetic force generated by the second group of coils balance with each other and cancel out each other.

Moreover, a superconductive magnet according to the present invention is provided with a first group of coils serving as main coils for generating a magnetic field and a second group of coils serving as shield coils that are arranged coaxially with the first group of coils and generate a magnetic field whose direction is opposite the direction of a magnetic field generated by the first group of coils so that a magnetic field that leaks outside from the first group of coils is cancelled; letting the center of a region where a magnetic field is generated by the first group of coils be an origin, the second group of coils are arranged at axis-direction positions in such a way that the axis-direction coordinate of the most distal end, in axis direction, of the second group of coils is 0.63 to 0.87 of the axis-direction coordinate of the most distal end, in axis direction, of the first group of coils.

In a superconductive magnet according to the present invention, the shield bobbin and the bobbin supporting member can be simplified; therefore, the amount of materials for the shield-coil supporting structure and the machining cost can be reduced. Furthermore, the weight of the whole magnet can be reduced; thus, the amount of coolant required for cooling can be reduced. Accordingly, in order to cope with the increase, in the material costs and machining costs of bobbins and supporting structures, which is caused by the increase in the electromagnetic force of a superconductive magnet, the amount of used bobbin materials and supporting members is considerably reduced; therefore, the costs of material procurement, machining, and cooling can be reduced, and the weight saving can also be achieved.

The foregoing and other objects, features, aspects and advantages of the present invention will become more apparent from the following detailed description of the present invention when taken in conjunction with the accompanying drawings.

DETAILED DESCRIPTION OF THE INVENTION

Embodiment 1

Figure 1:
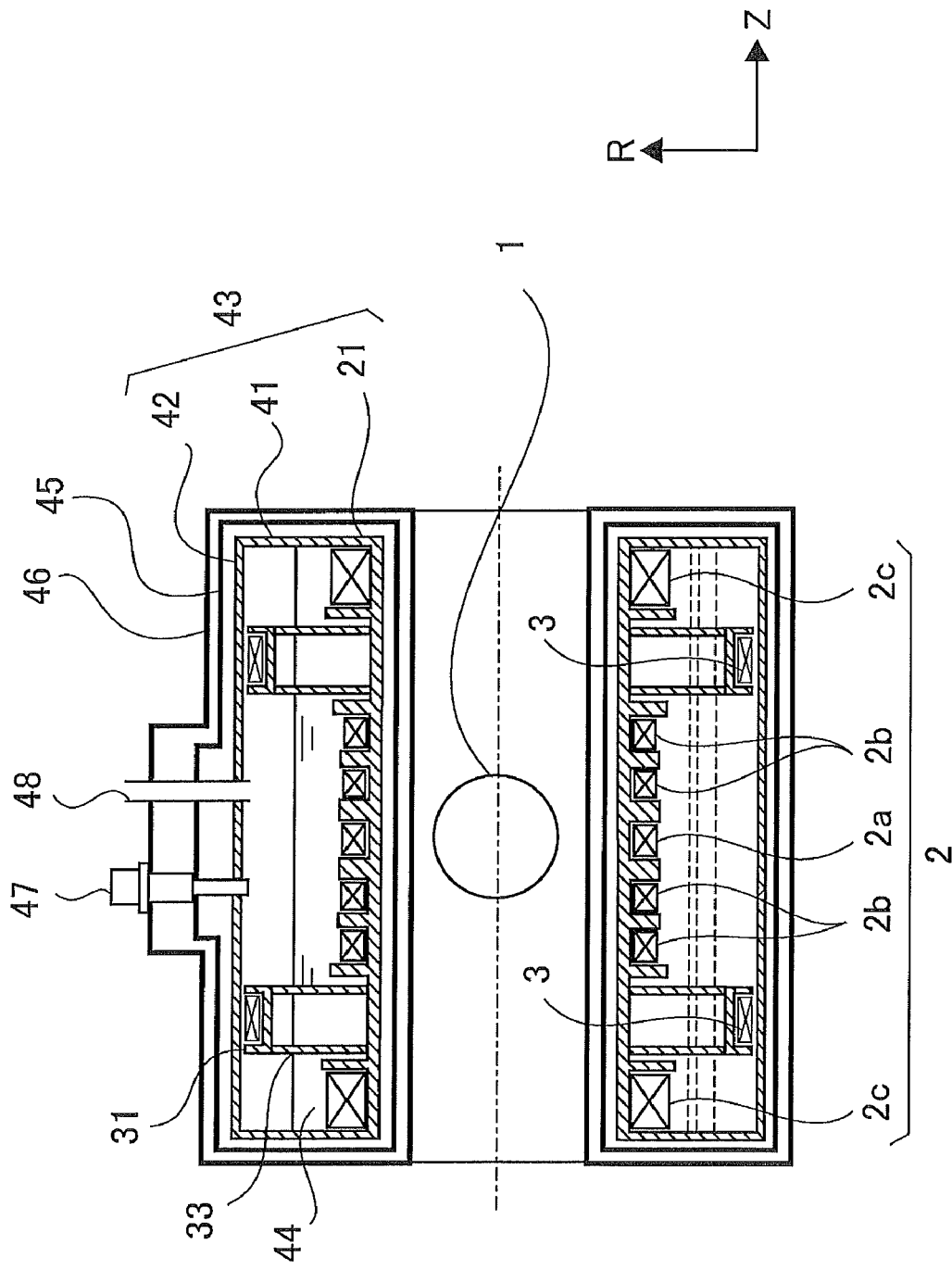
FIG. 1 is a cross-sectional view illustrating the structure of a superconductive magnet according to Embodiment 1 of the present invention.

FIG. 1 is a cross-sectional view, taken along a plane parallel to the Z axis, of a superconductive magnet according to Embodiment 1 of the present invention. In addition, in each of the figures, the same reference marks indicate the same or equivalent constituent elements, and some of explanations therefor will be omitted. In FIG. 1, reference numeral 1 denotes a magnetic-field generation region where a magnetic field is produced; reference numeral 2 denotes a main coil for generating a desired magnetic field in the magnetic-field generation region 1; reference numeral 3 denotes a shield coil for cancelling a magnetic field that leaks outward. The shield coil 3 is disposed in such a way as to be coaxial with the Z axis of the main coil 2 and more distal than the main coil 2 from the Z axis (the radial distance between the Z axis and the center of the shield coil 3 is larger than the radial distance between the Z axis and the center of the main coil 2). The main coil 2 and the shield coil 3 are formed in such a manner that a superconductive wire made of, for example, niobium titanium and copper is wound and fixed with an epoxy resin; the main coil 2 and the shield coil 3 are wound around a main bobbin 21 and a shield bobbin 31, respectively, contained in a helium tank 43, and held at a constant position. The shield bobbin 31 is supported by the shield bobbin supporting member 33 in such a way as to be coupled with the main bobbin 21. The foregoing coils become superconductive by being cooled down to a cryogenic temperature.

The main coil 2 includes three kinds of coils, i.e., a central coil 2a, a middle coil 2b, and a side coil 2c. At the center position in the Z direction (Z-axis direction) there is disposed a single central coil 2a; the middle coils 2b are disposed in such a way as to be symmetric with each other with respect to a plane that passes the center (origin) of the magnetic field and is perpendicular to the Z axis; the side coils 2c are disposed in such a way as to be symmetric with each other with respect to the plane that passes the center (origin) of the magnetic field and is perpendicular to the Z axis; the shield coils 3 are disposed in such a way as to be symmetric with each other with respect to the plane that passes the center (origin) of the magnetic field and is perpendicular to the Z axis. At the ends of the main bobbin 21, there are mounted helium tank flanges 41; at the top of the helium tank flanges 41, there is mounted a helium tank outer cylinder 42. The combination of the main bobbin 21, the helium tank flange 41, and the helium tank outer cylinder 42 forms the helium tank 43, where liquid helium 44 for cooling the superconductive coil is stored.

The main bobbin 21, the shield bobbin 31, the shield bobbin supporting member 33, the helium tank flange 41, and the helium tank outer cylinder 42 are each formed of a non-magnetic material such as stainless steel or aluminum. The helium tank 43 is enclosed by a thermal shield 45 that cuts off inbound radiation heat; the thermal shield 45 is covered with a vacuum tank 46 that performs vacuum insulation of the inside of the magnet. The thermal shield 45 is made of a non-magnetic material, having a high reflectance, such as aluminum; an unillustrated multi-layer heat insulator (super insulation) is adhered on the surface of the thermal shield 45.

The vacuum tank 46 is formed of a non-magnetic material such as aluminum or stainless steel. At the top of the magnet, there are provided a refrigerator 47 for re-liquefying helium that has cooled the thermal shield 45 and has been gasified and a service port 48 for refueling liquid helium and performing magnetization/demagnetization.

The superconductive magnet according to Embodiment 1 incorporates seven main coils 2 (one central coil 2a, four middle coils 2b, two side coils 2c) and two shield coils 3. Seven main coils 2 configure a first coil group, and two shield coils 3 configure a second coil group. The vacuum tank 46 is evacuated to be vacuum-insulated and liquid helium is reserved in the helium tank 43, so that the superconductive coil is cooled down to an absolute temperature of 4.2° K, whereby the main coils 2 and the shield coils 3 are rendered superconductive. The main coils 2 and the shield coils 3 are all connected in series with one another; by applying a current of approximately 450 A to the foregoing coils, a magnetic field of approximately 1.5 tesla can be generated in the magnetic-field generation region 1.

The main coils 2 and the shield coils 3 satisfy three conditions, i.e., (1) a magnetic field of 1.5 tesla is generated in the magnetic-field generation region 1, (2) the heterogeneity of the magnetic field in the magnetic-field generation region (a spherical space having a diameter of 50 cm) is the same as or smaller than 10 ppm, and (3) a region having a leakage magnetic field of 0.5 millitesla does not spread 5 m or more from the superconductive magnet, and are arranged in such a way that the amount of used superconductive wires is reduced and the electromagnetic force exerted on the shield coils 3 is minimized.

Figure 2:
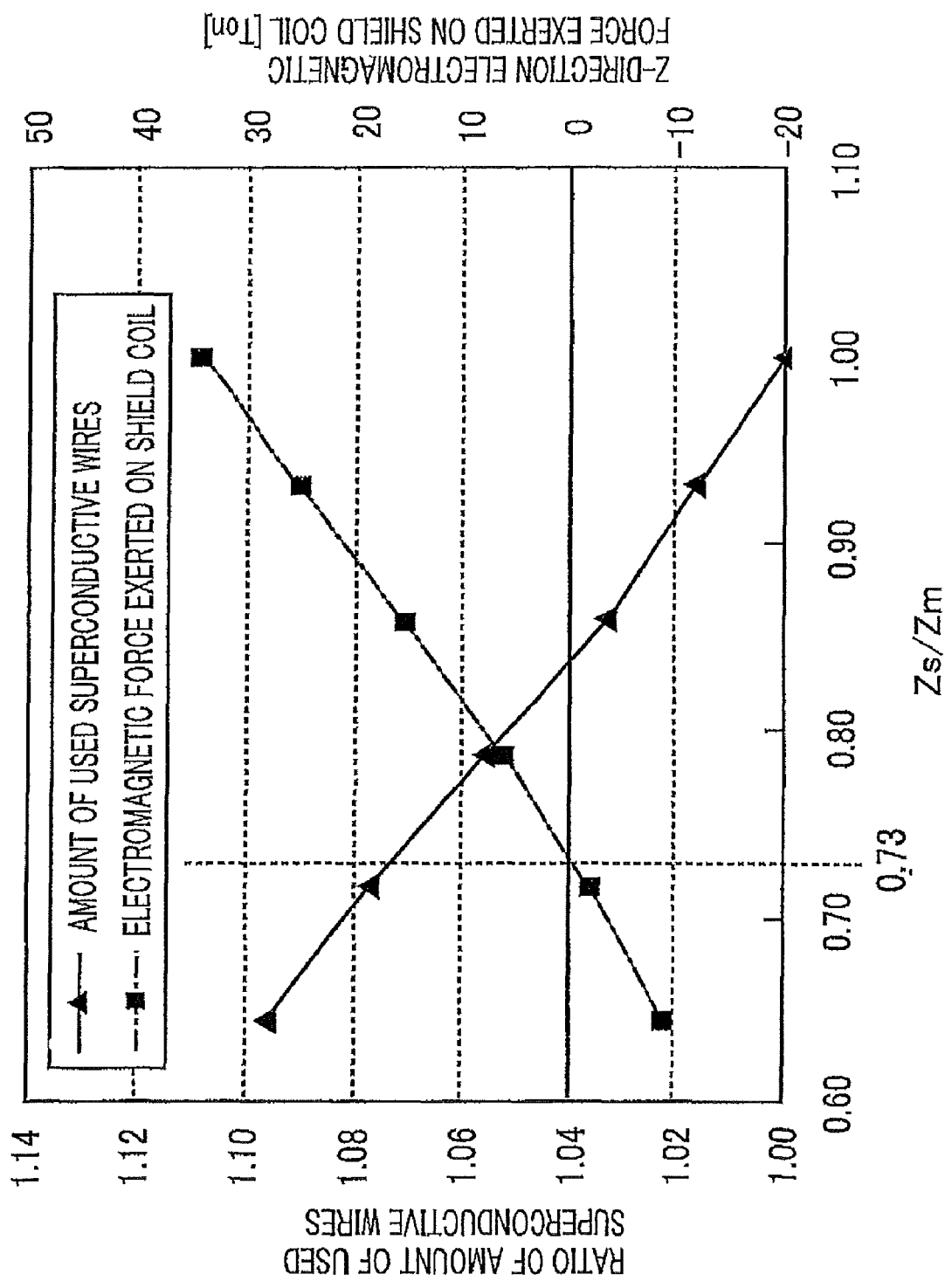
FIG. 2 is a graph representing the relationship among the Z-direction position of a shield coil, the amount of used superconductive wires, and the electromagnetic force exerted on the shield coil in Embodiments 1 to 5.
Figure 3:
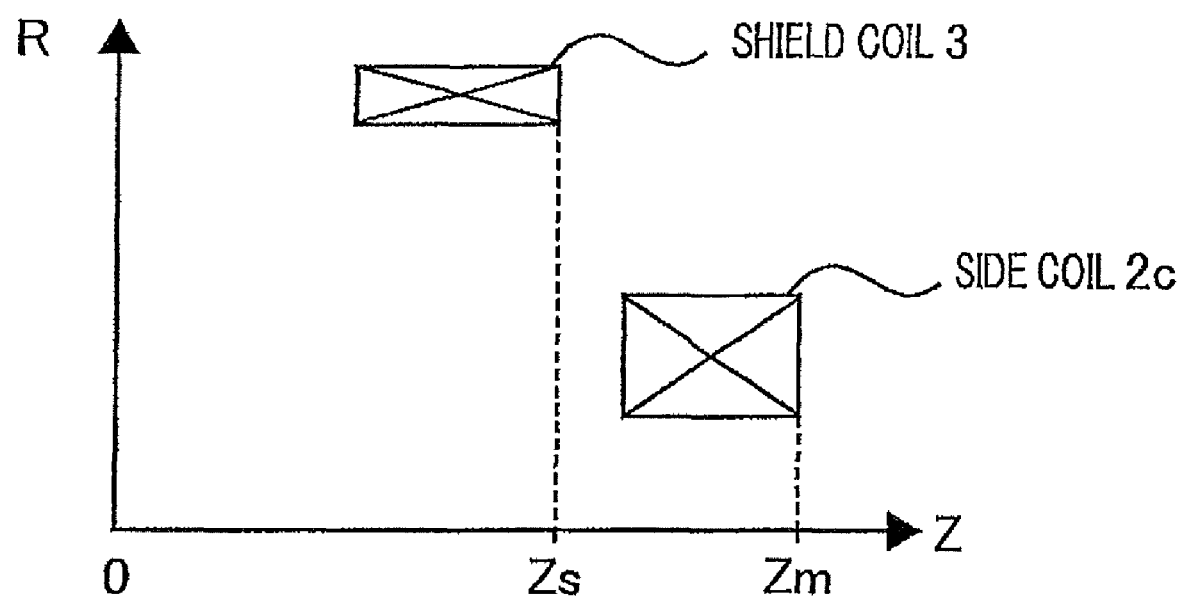
FIG. 3 is a chart representing definitions for Z-direction coordinates Zs and Zm of a coil.

In this situation, as represented in FIG. 2, the electromagnetic force exerted on the shield coil 3 and the amount of used superconductive wires change depending on the Z coordinate of the position where the shield coil 3 is disposed. In FIG. 2, the abscissa denotes the ratio (hereinafter, referred to as Zs/Zm) of the Z coordinate (Zs) of the distal end, in the axis direction, of the shield coil 3 to the Z coordinate (Zm) of the distal end, in the axis direction, of the main coil 3 (refer to FIG. 3); the left-hand ordinate denotes the ratio of the amount of used superconductive wires for the superconductive magnet; the right-hand ordinate denotes the Z-direction electromagnet force exerted on the shield coil 3. FIG. 3 is a chart representing the definitions for the Z coordinate (Zs) of the distal end, in the axis direction, of the shield coil 3 and the Z coordinate (Zm) of the distal end, in the axis direction, of the main coil 2. In the case where the shield coil 3 is included in the second coil group consisting of one or a plurality of coils, Zs is the Z coordinate of the distal end of the one coil or the most distal coil out of the plurality of coils. In the case where the main coil 2 is included in the first coil group consisting of one or a plurality of coils, Zm is the Z coordinate of the distal end of the one coil or the most distal coil out of the plurality of coils.

Figure 13:
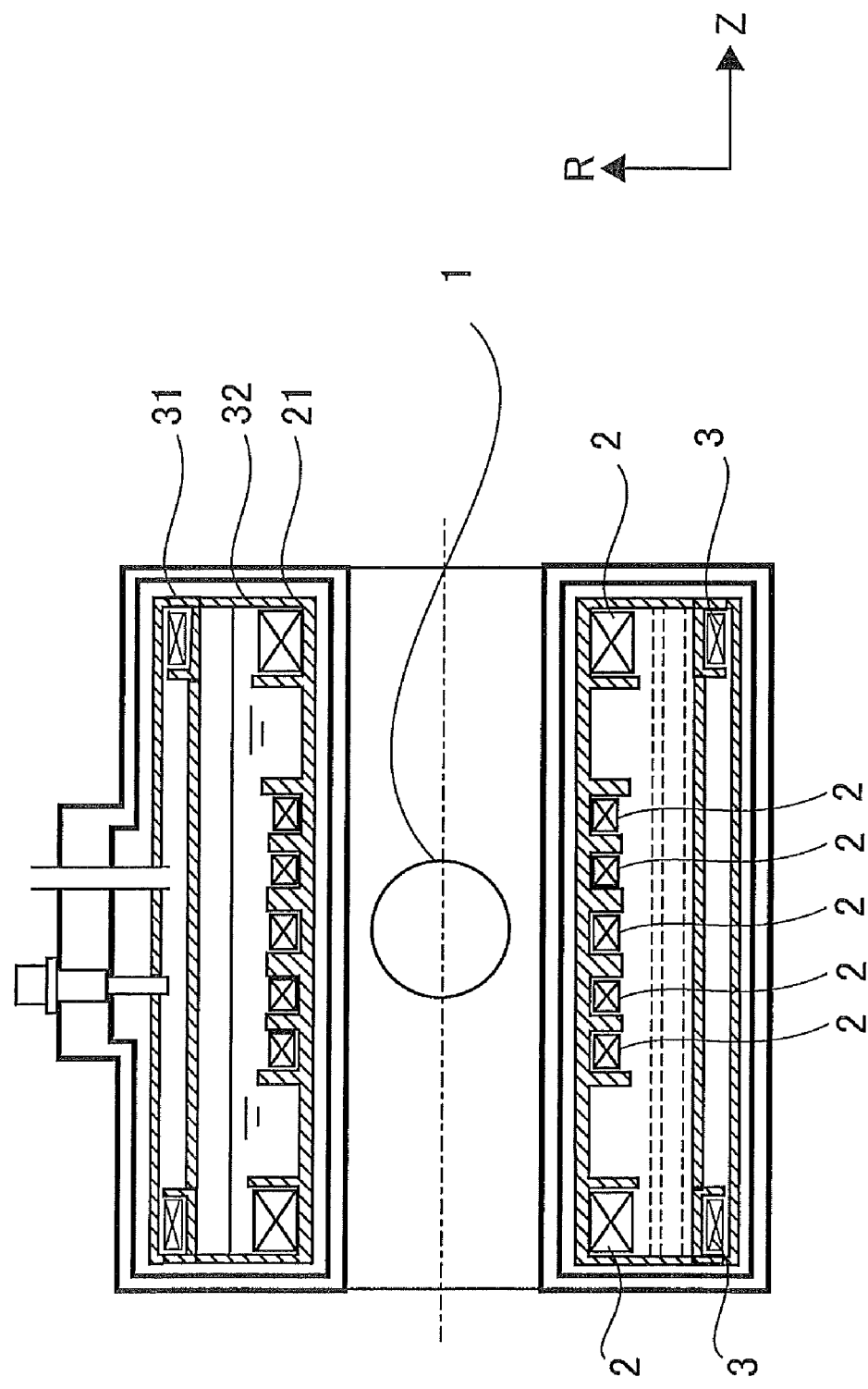
FIG. 13 is a cross-sectional plan view of the conventional superconductive magnet in FIG. 12.

As illustrated by the cross-sectional view in FIG. 13, in the conventional superconductive magnet, Zs/Zm is equal to 1 or a value close to 1. In this situation, the Z-direction electromagnetic force exerted on the shield coil 3 is an extremely large value of 35 ton and tends to increase. When Zs/Zm is within a range from 0.63 to 0.87, the electromagnetic force exerted on the shield coil 3 is halved, and the amount of used superconductive wires can be suppressed to a level that is approximately 9% as large as the amount of superconductive wires used in the conventional superconductive magnet. When Zs/Zm is within a range from 0.63 to 0.81, the electromagnetic force exerted on the shield coil 3 is reduced to be ⅓, and the amount of used superconductive wires can be suppressed to a level that is approximately 9% as large as the amount of superconductive wires used in the conventional superconductive magnet. When Zs/Zm is within a range from 0.73 to 0.87, the electromagnetic force exerted on the shield coil 3 is halved, and the amount of used superconductive wires can be suppressed to a level that is approximately 7% as large as the amount of superconductive wires used in the conventional superconductive magnet. When Zs/Zm is within a range from 0.73 to 0.81, the electromagnetic force exerted on the shield coil 3 is reduced to be ⅓, and the amount of used superconductive wires can be suppressed to a level that is approximately 7% as large as the amount of superconductive wires used in the conventional superconductive magnet.

In Embodiment 1, Zs/Zm is equal to a value close to 0.73, in the vicinity of which the axis-direction electromagnetic force, which is produced by the first coil group (main coils), exerted on the second coil group (shield coils) and the axis-direction electromagnetic force, which is produced by the second coil group, balance out and cancel out each other. In this situation, the amount of used superconductive wires is 7% as large as the amount of superconductive wires used in the conventional superconductive magnet; however, the Z-direction electromagnetic force becomes approximately zero.

The reason why, when Zs/Zm becomes small, the z-direction electromagnetic force exerted on the shield coil 3 is reduced is described below. Because the polarity of the main coil 2 (2a, 2b, 2c) is opposite the polarity of the shield coil 3, the main coil 2 and the shield coil 3 produce electromagnetic forces that repulse each other. Accordingly, in the case where Zs/Zm is 1 or larger, all the electromagnetic forces produced by the three main coils 2 (2a, 2b, 2c) and exerted on the shield coil 3 have a direction of +Z.

However, when Zs/Zm is small, i.e., the shield coil 3 is disposed at a position that is more proximal in the Z direction than the side coil 2c, the electromagnetic force produced by the side coil 2c and exerted on the shield coil 3 has a direction of −Z and cancels out the electromagnetic forces having a direction of +Z produced by the central coil 2a and the middle coil 2b. Accordingly, the Z-direction electromagnetic force exerted on the shield coil 3 is reduced.

Due to the arrangement of the shield coil 3, the Z-direction electromagnet force exerted on the shield coil 3 becomes approximately zero. The R-direction electromagnet force is also exerted on the shield coil 3; however, because exerted outward in the R direction, this electromagnet force is not exerted on the bobbins and the supporting members per se. Accordingly, the shield bobbin supporting member is not required to support the shield bobbin for such a large electromagnetic force as is exerted on the shield bobbin of the conventional superconductive magnet; the shield bobbin supporting member may just support the shield bobbin for its own weight. In Embodiment 1, the shield bobbin 31 is supported by the shield bobbin supporting member 33 that is extended perpendicularly from the main bobbin 21. The shield bobbin supporting member 33 is a disc having a thickness of, for example, 10 mm, and is made of a non-magnetic material such as stainless steel. At the middle of the shield bobbin supporting member 33, there is provided an opening through which the main bobbin 21 passes; the shield bobbin supporting member 33 is ring- and disc-shaped as a whole. The shield bobbin supporting member 33, the main bobbin 21, and the shield bobbin 31 are coupled with one another through welding. The shield bobbin supporting member 33 is welded at a Z-direction position, in the main bobbin 21, in which no main coil 2 exists. As described above, the helium tank flange 41, the shield bobbin 31, and the shield bobbin supporting member 33 are coupled through welding; however, there are demonstrated the same operation and effect in the case where they are coupled through another coupling means such as bolt screwing.

As described above, in Embodiment 1, the superconductive coils are not arranged in such a way that the amount of used superconductive wires is minimized; however, while the increase in the amount of used superconductive wires is suppressed (to be less 10%), the Z-direction electromagnetic force exerted on the shield coil 3 is largely reduced (halved, 1/3, or approximately zero). As a result, the shield bobbin, which has been a single cylindrical member, can be divided into a number of shield bobbins corresponding to the number of shield coils, whereby the supporting structure can be simplified. Accordingly, in order to cope with the increase, in the material costs and machining costs of bobbins and supporting structures, which is caused by the increase in the electromagnetic force of a superconductive magnet of recent years, the amount of used bobbin materials and supporting members is considerably reduced; therefore, the costs of material procurement, machining, and cooling can be reduced, and the weight saving can also be achieved. Moreover, in a conduction-cooling superconductive magnet, the cooling time can be shortened.

Embodiment 2

Figure 4:
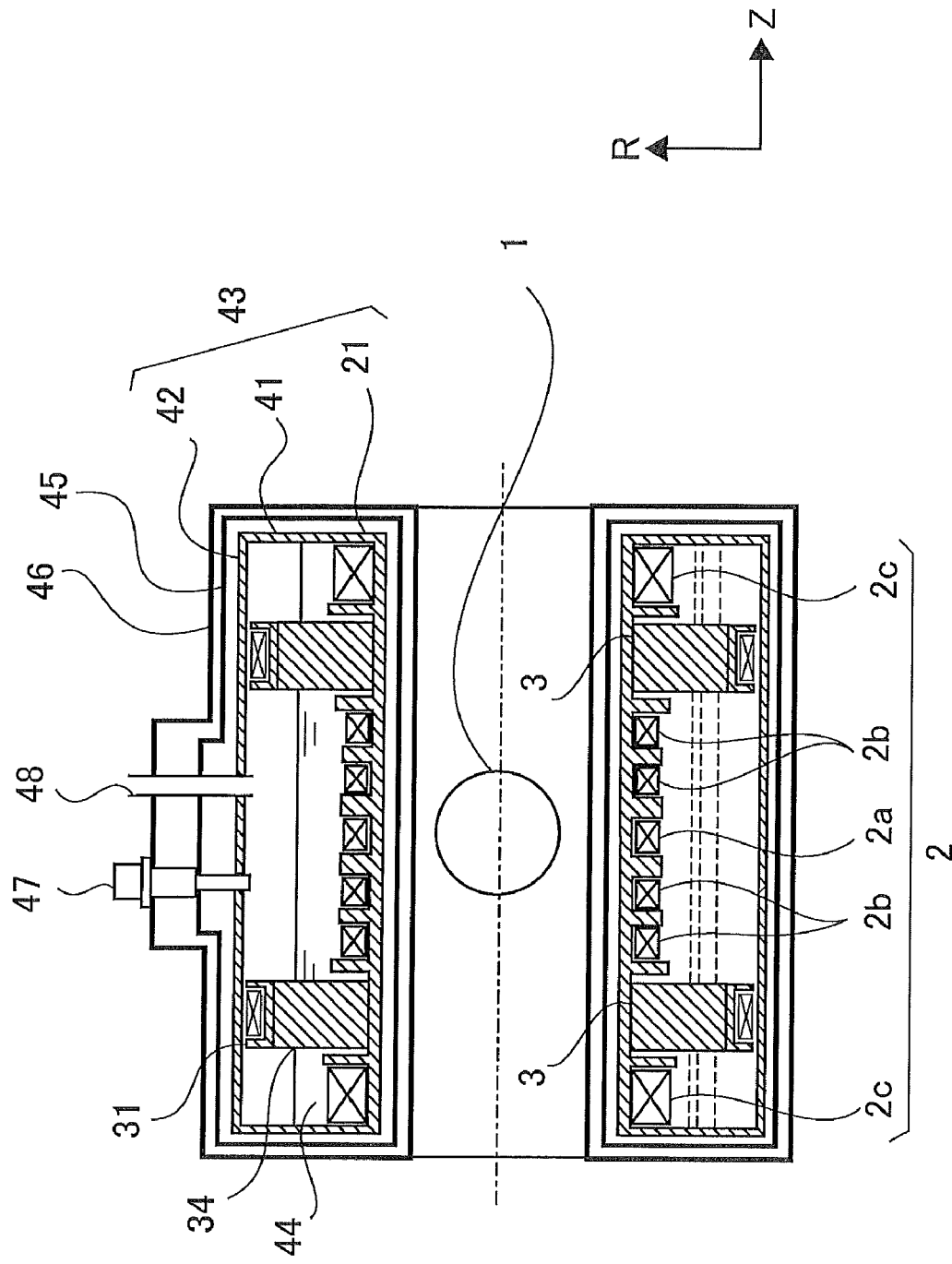
FIG. 4 is a cross-sectional view, taken along a plane parallel to the Z direction, of a superconductive magnet according to Embodiment 2.
Figure 5:
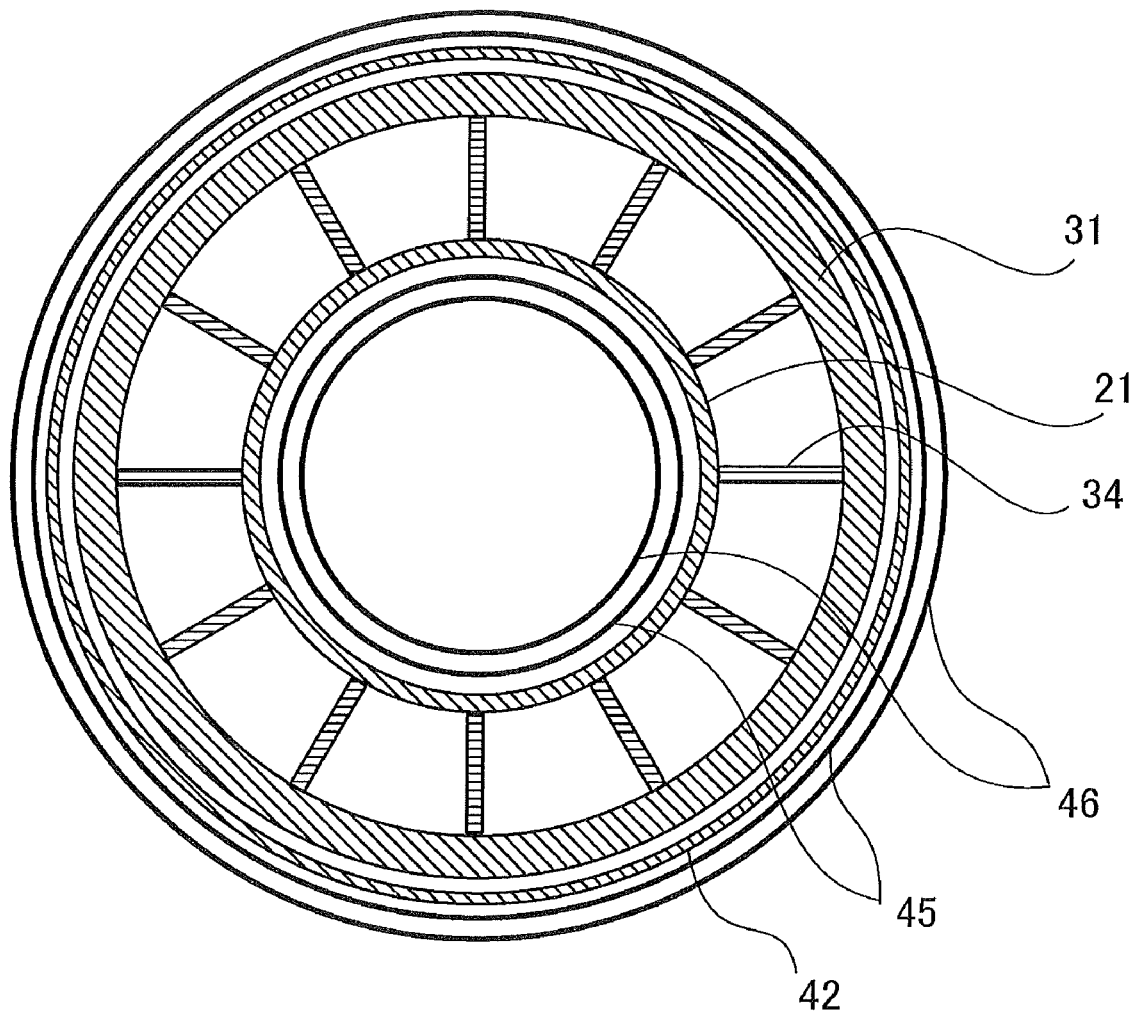
FIG. 5 is a cross-sectional view, taken along a plane perpendicular to the Z direction, of the superconductive magnet in FIG. 4.

FIG. 4 is a cross-sectional view, taken along a plane parallel to the Z axis, of a superconductive magnet according to Embodiment 2. FIG. 5 is a cross-sectional view, taken along a plane perpendicular to the Z axis, of the superconductive magnet in FIG. 4. The superconductive magnet according to Embodiment 2 is similar to the superconductive magnet according to Embodiment 1 in that there are included a main coil 2, a main bobbin 21, shield coils 3, shield bobbins 31, helium tank flanges 41, a helium tank outer cylinder 42, a thermal shield 45, a vacuum tank 46, a refrigerator 47, and a service port 48. The arrangement of the shield coil 3 is similar to the superconductive magnet according to Embodiment 1 in that Zs/Zm is made to be approximately 0.73, in order to arrange the shield coil 3 at a position where the Z-direction electromagnetic force exerted on the shield coil 3 is minimized while the increase in the amount of used superconductive wires is suppressed.

A shield bobbin supporting member 34 of the superconductive magnet according to Embodiment 2 is tabular; by disposing the shield bobbin supporting member 34 in such a way that the plate surface is in parallel with the Z axis, the main bobbin 21 and the shield bobbin 31 are coupled with each other. The shield bobbin supporting member 34 is formed of a non-magnetic material, having a thickness of, for example, 20 mm, such as stainless steel; 12 shield bobbin supporting members 34 are arranged at 30-degree pitch for each shield coil, i.e., totally 24 shield bobbin supporting members 34 are arranged in the magnet as a whole. The shield bobbin supporting member 34, the main bobbin 21, and the shield bobbin 31 are fixed and coupled with one another through welding. The shield bobbin supporting member 34 and the shield bobbin 31 are coupled with each other through welding; however, they may be coupled with each other through another coupling means such as bolt screwing. In Embodiment 2, in the case where the weights of the shield coil 3 and the shield bobbin 31 are small, the plate thickness and the number of the shield bobbin supporting member 34 can be reduced; therefore, Embodiment 2 has an advantage that the amount of the materials for the shield bobbin supporting member 34 is small.

As described above, also in Embodiment 2, as is the case with other Embodiments, by arranging the shield coil 3 at a position where the Z-direction electromagnetic force is small, the shield bobbin 31, which has been a single cylindrical member, can be divided into a number of shield bobbins corresponding to the number of shield coils, whereby the supporting structure can be simplified. As a result, the amount of used bobbin materials and supporting members is considerably reduced; thus, the costs of material procurement, machining, and cooling can be reduced, and the weight saving can also be achieved.

Embodiment 3

Figure 6:
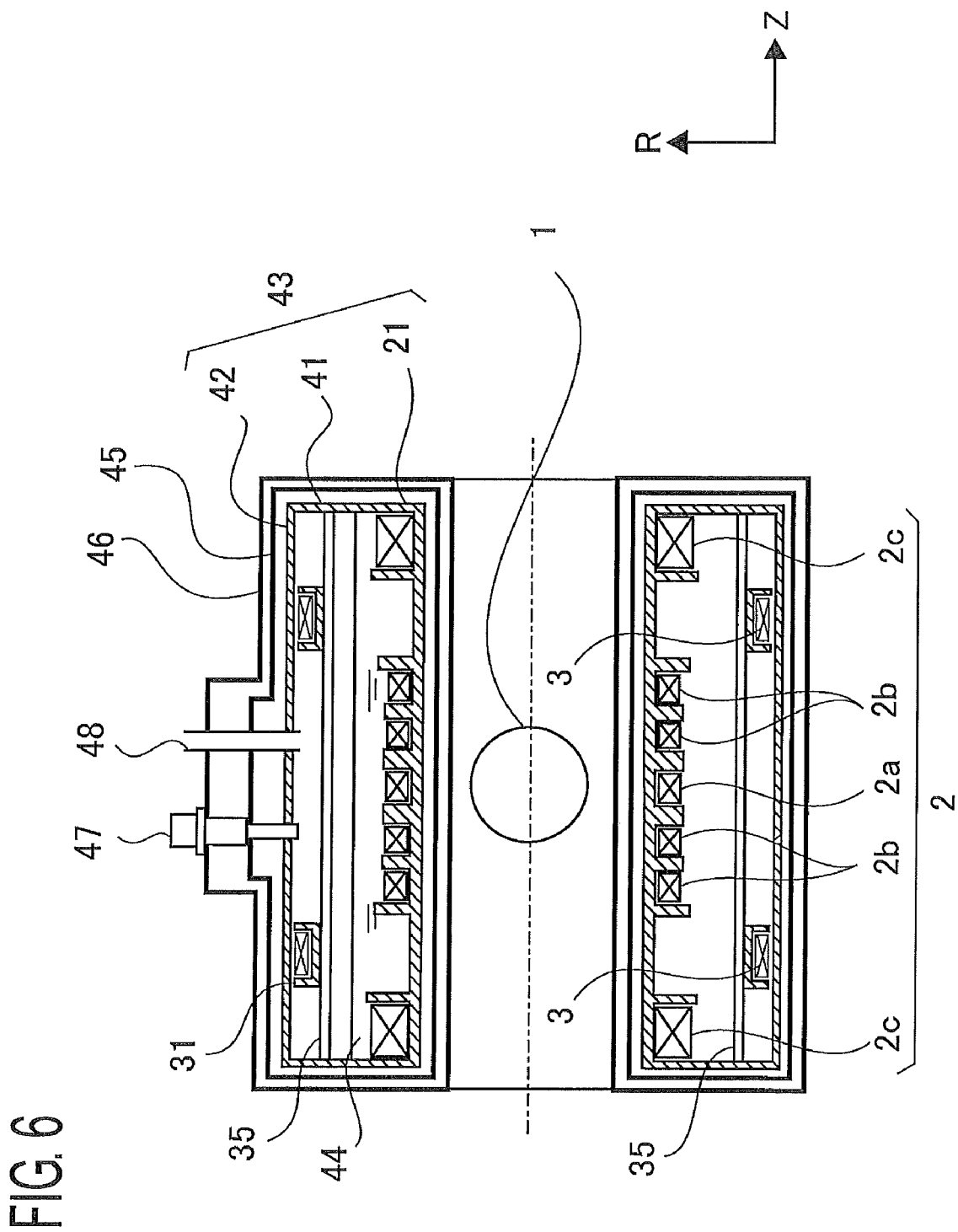
FIG. 6 is a cross-sectional view, taken along a plane parallel to the Z axis, of a superconductive magnet according to Embodiment 3.
Figure 7:
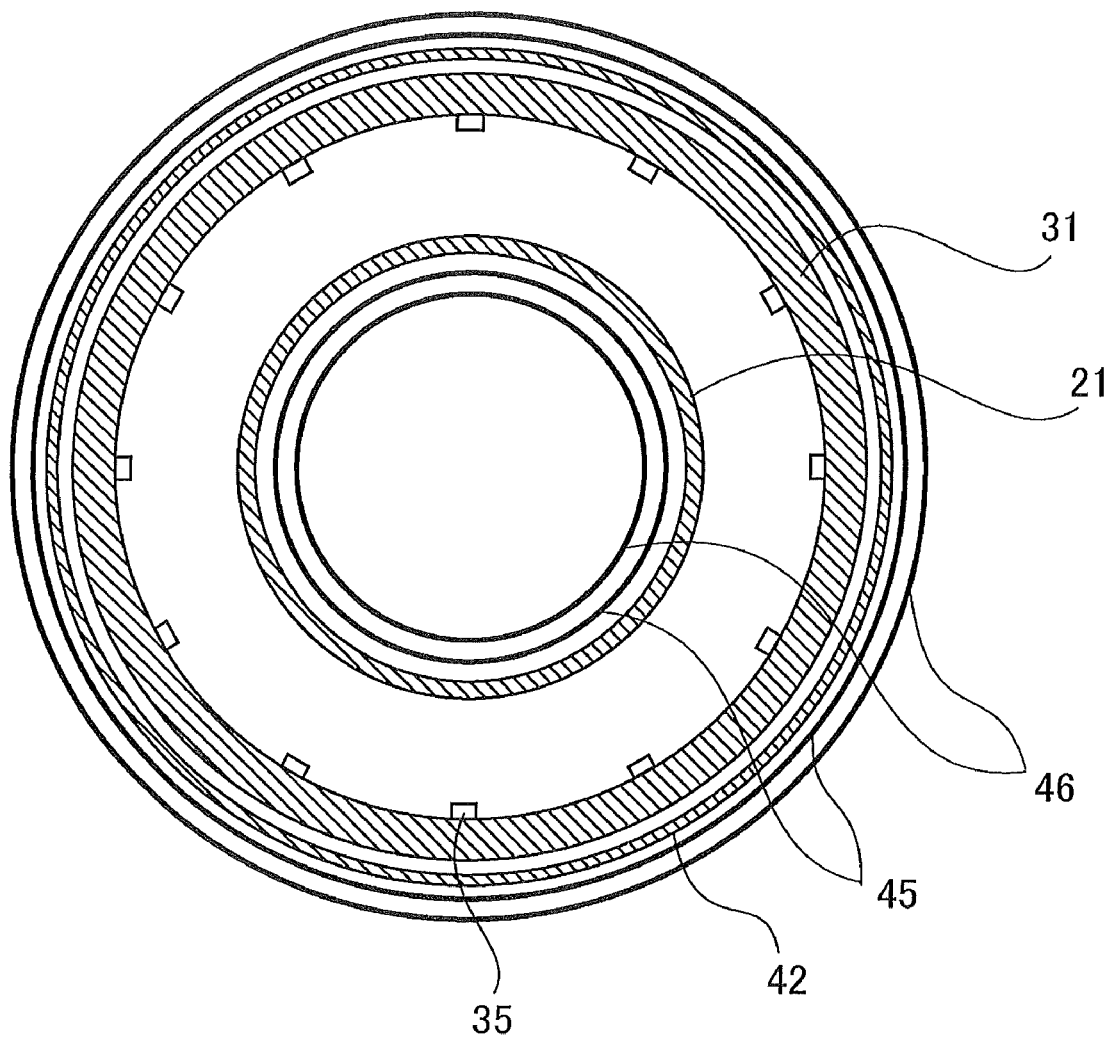
FIG. 7 is a cross-sectional view, taken along a plane perpendicular to the Z axis, of the superconductive magnet in FIG. 6.

FIG. 6 is a cross-sectional view, taken along a plane parallel to the Z axis, of a superconductive magnet according to Embodiment 3. FIG. 7 is a cross-sectional view, taken along a plane perpendicular to the Z axis, of the superconductive magnet in FIG. 6. The superconductive magnet according to Embodiment 3 is similar to the superconductive magnet according to Embodiment 1 in that there are included a main coil 2, a main bobbin 21, shield coils 3, shield bobbins 31, helium tank flanges 41, a helium tank outer cylinder 42, a thermal shield 45, a vacuum tank 46, a refrigerator 47, and a service port 48. The arrangement of the shield coil 3 is similar to the superconductive magnet according to Embodiment 1 in that Zs/Zm is made to be approximately 0.73, in order to arrange the shield coil 3 at a position where the Z-direction electromagnetic force exerted on the shield coil 3 is minimized while the increase in the amount of used superconductive wires is suppressed.

In Embodiment 3, the shield bobbins 31 are arranged on a beam 35 bridged between the opposite helium tank flanges 41. The beam 35 is a square timber formed of a non-magnetic material such as stainless steel; 12 beams 35 are arranged at 30-degree pitch in the magnet as a whole. In a place, of the beam 35, in which the shield coil is to be mounted, mating grooves are provided so that the shield bobbin 31 can be mounted. The shield bobbin 31 is disposed in such a way as to mate with the mating grooves, and then is fixed and coupled with the beam 35 through welding. The helium tank flange 41, the shield bobbin 31, and the beam 35 are coupled with one another through welding; however, they may be coupled with one another through another coupling means such as bolt screwing.

As described above, also in Embodiment 3, as is the case with other Embodiments, by arranging the shield coil 3 at a position where the Z-direction electromagnetic force is small, the supporting structure can be simplified. As a result, the amount of used bobbin materials and supporting members is considerably reduced; thus, the costs of material procurement, machining, and cooling can be reduced, and the weight saving can also be achieved.

Embodiment 4

Figure 8:
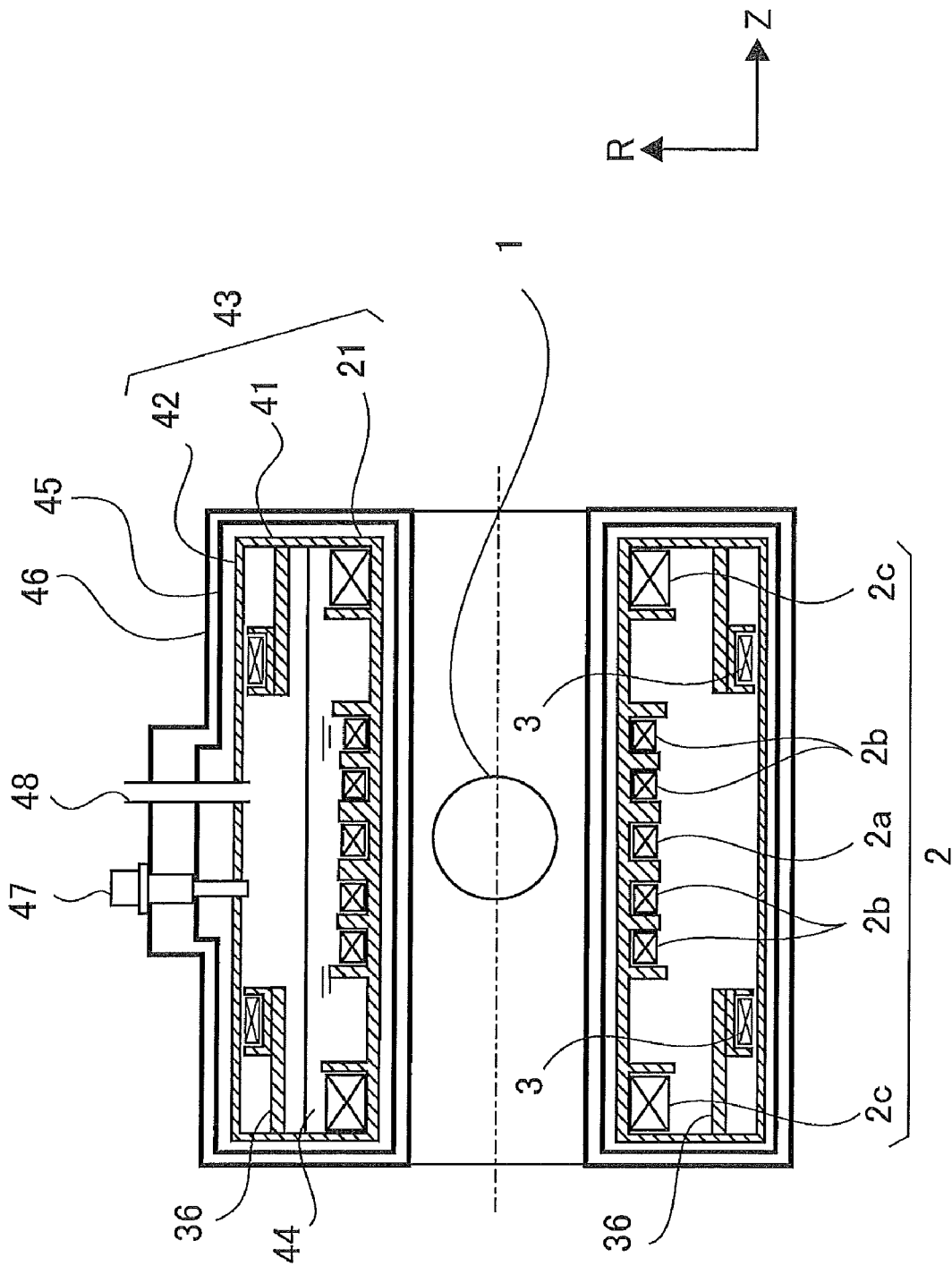
FIG. 8 is a cross-sectional view illustrating the structure of a superconductive magnet according to Embodiment 4.
Figure 9:
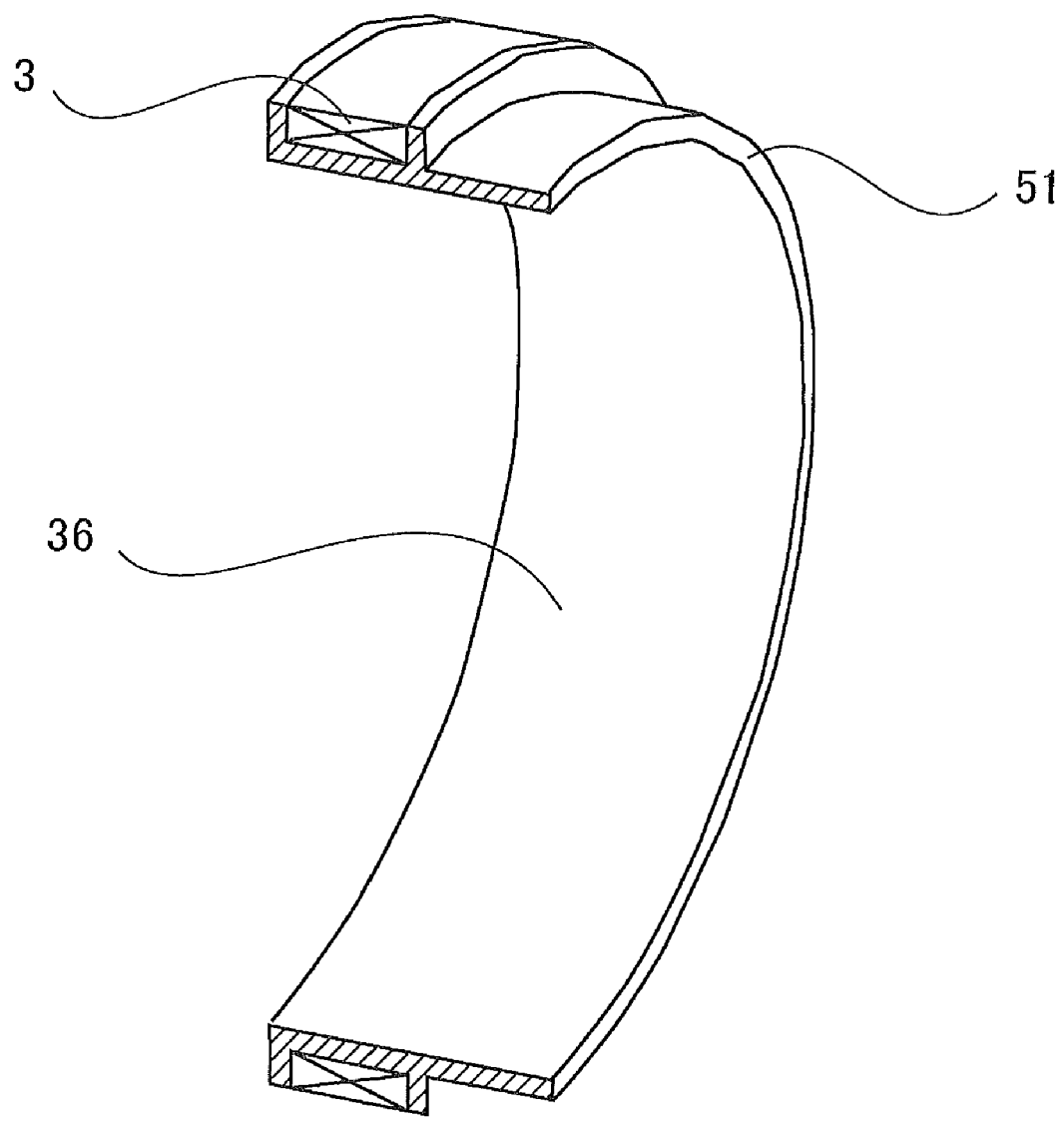
FIG. 9 is a cross-sectional perspective view of a shield coil and a shield bobbin in Embodiment 4.

FIG. 8 is a cross-sectional view illustrating the structure of a superconductive magnet according to Embodiment 4. What differ from Embodiment 1 will be explained. In Embodiment 4, a shield bobbin 36 differs in shape from the shield bobbins in other embodiments. FIG. 9 is a cross-sectional perspective view of a shield coil 3 and the shield bobbin 36. The shield bobbin 36 largely extends out in the Z-axis direction and has a junction portion 51 for a helium tank flange 41; the junction portion 51 is coupled with the helium tank flange 41. The coupling portion is fixed through welding. They may be coupled with each other through another coupling means such as bolt screwing. Also in Embodiment 4, as is the case with other Embodiments, by arranging the shield coil 3 at a position where the Z-direction electromagnetic force is small, the supporting structure can be simplified. As a result, the amount of used bobbin materials and supporting members is considerably reduced; thus, the costs of material procurement, machining, and cooling can be reduced, and the weight saving can also be achieved.

Embodiment 5

Figure 10:
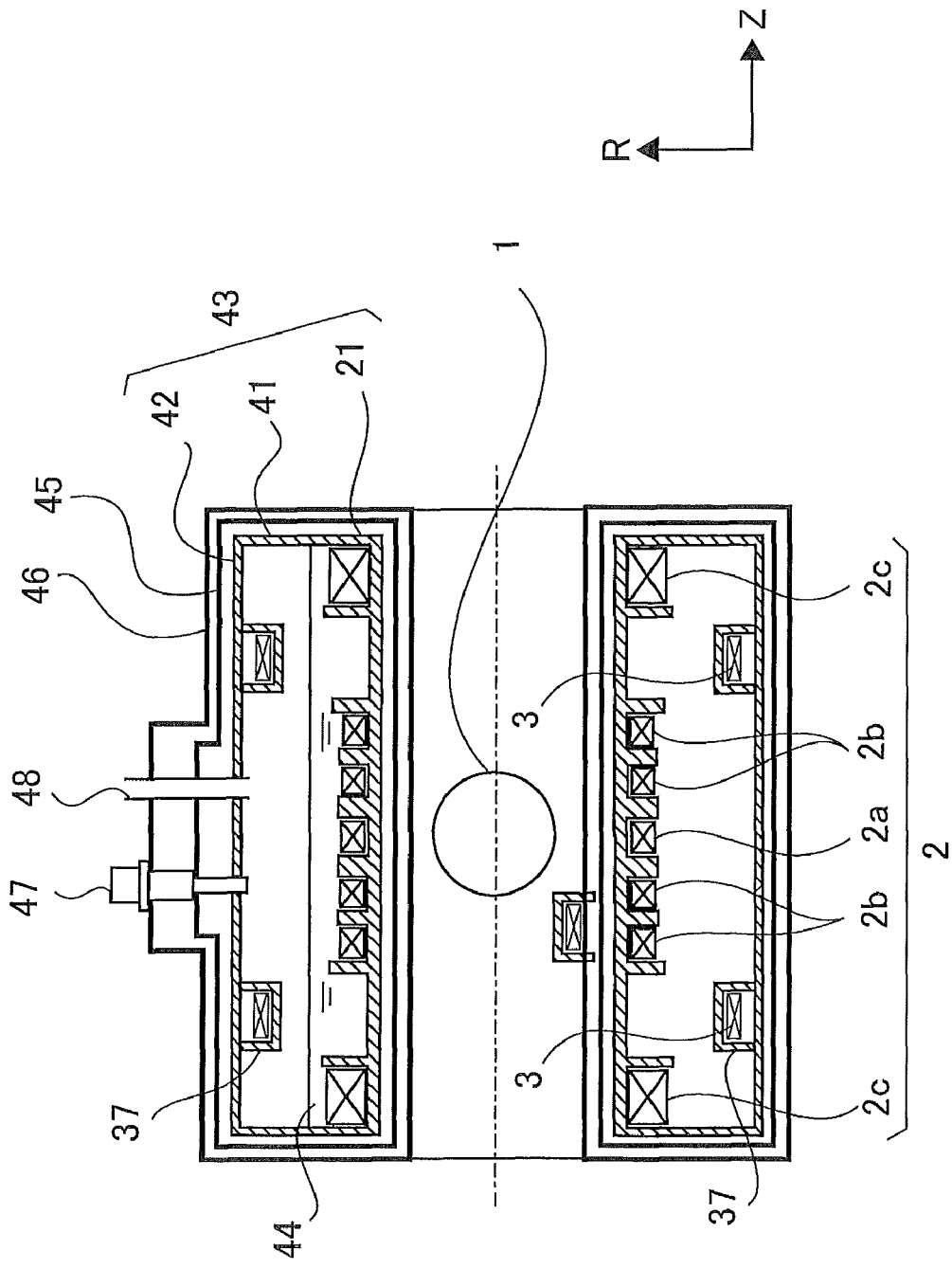
FIG. 10 is a cross-sectional view illustrating the structure of a superconductive magnet according to Embodiment 5.
Figure 11:
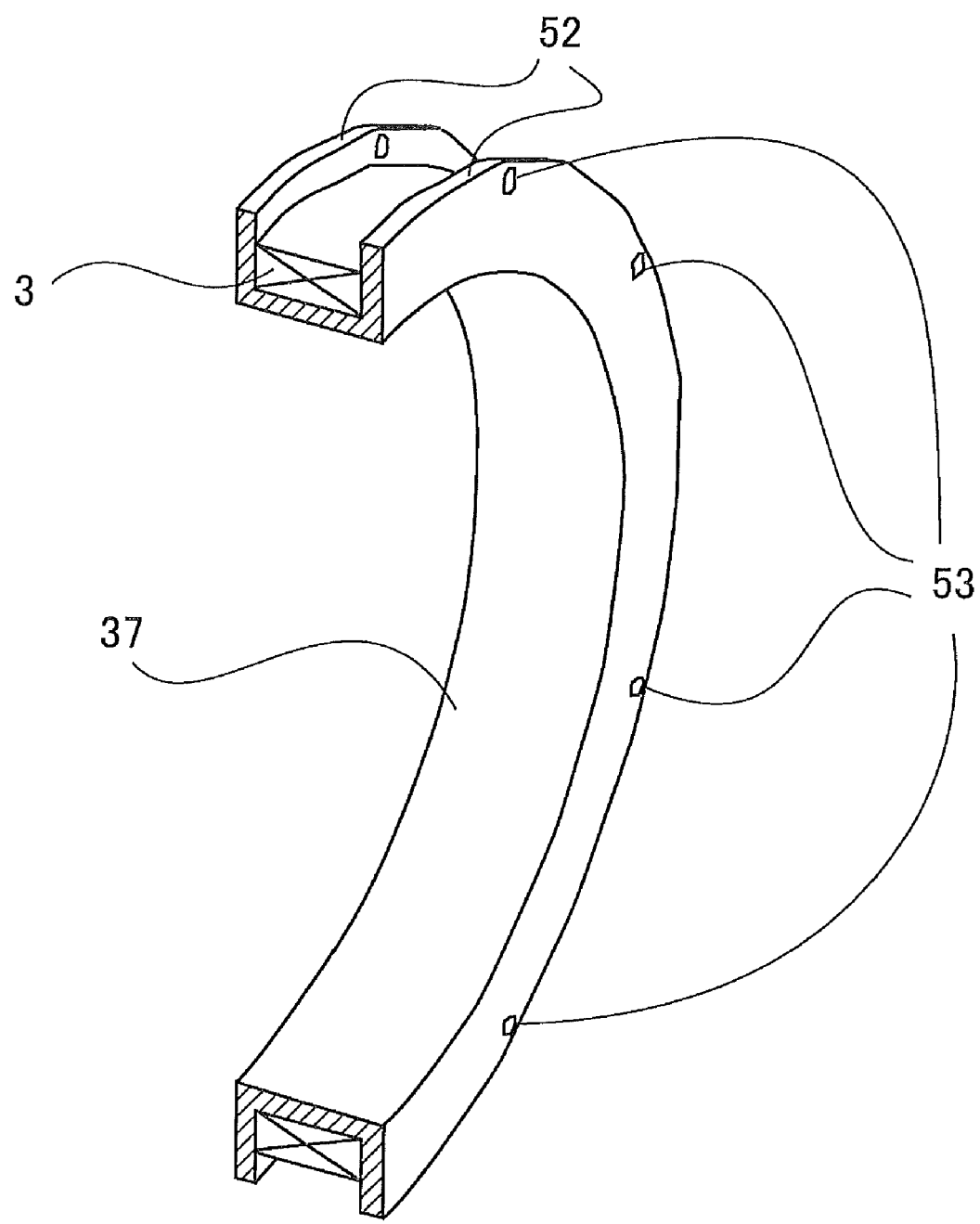
FIG. 11 is a cross-sectional perspective view of a shield coil and a shield bobbin in Embodiment 5.
Figure 12:
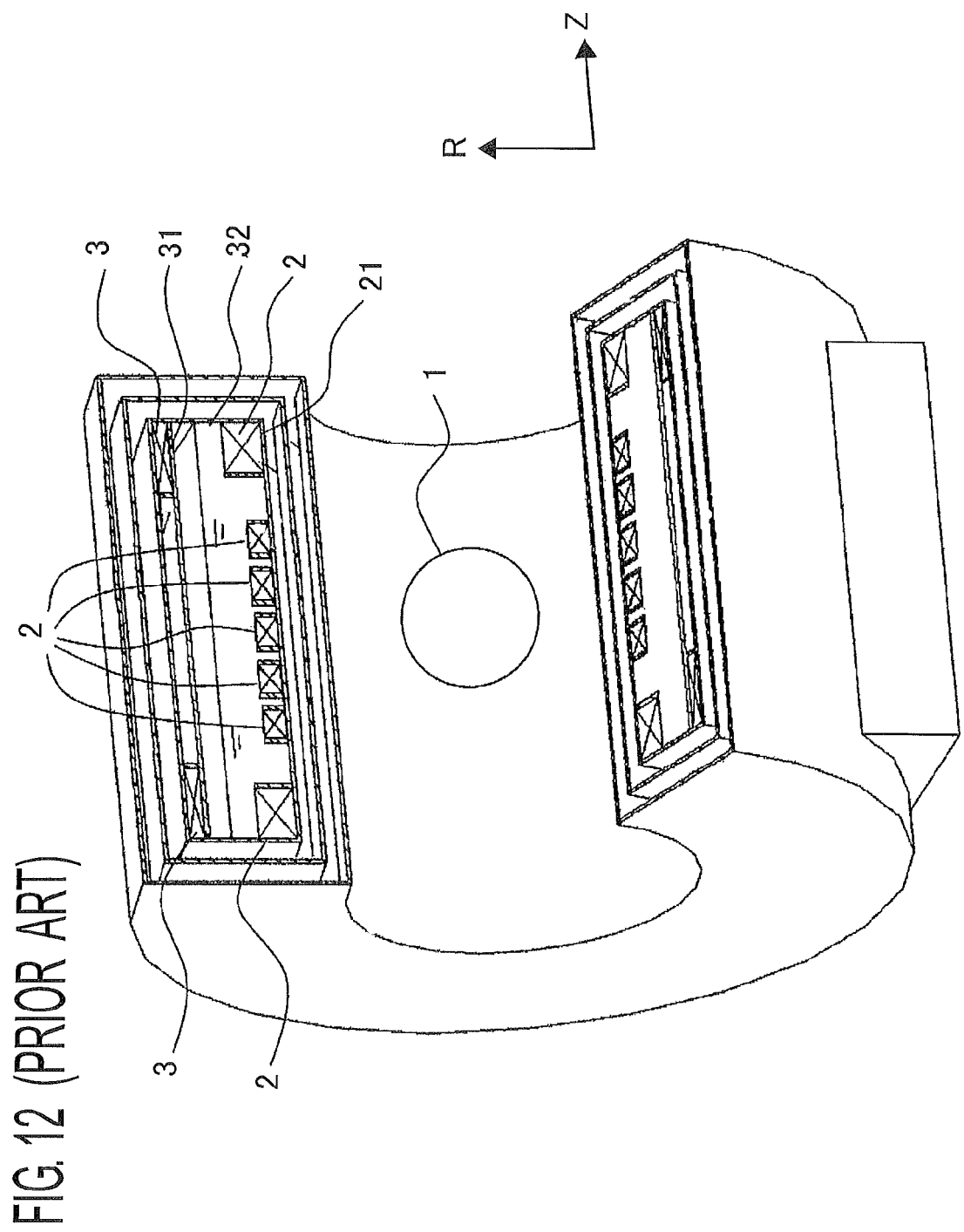
FIG. 12 is a cross-sectional perspective view illustrating the structure for a conventional superconductive magnet.

FIG. 10 is a cross-sectional view illustrating the structure of a superconductive magnet according to Embodiment 5. What differ from Embodiment 1 will be explained. In Embodiment 5, as illustrated in FIG. 11, a shield bobbin 37 differs in shape from the shield bobbins in other embodiments. The shield bobbin 37 has a high flange portion compared with the shield bobbins 31 and 36 in other Embodiments; the peripheral portion (junction portion 52) thereof is adhered to the inner surface of a helium tank outer cylinder 42. The junction portion 52 and the helium tank outer cylinder 42 are directly fixed to each other through welding. They may be coupled with each other through another coupling means such as bolt screwing. A helium path opening 53 is provided at the flange face of the shield bobbin 37; through the opening 53, liquid helium directly makes contact with a shield coil 3 so as to cool the shield coil 3. Also in Embodiment 5, as is the case with other Embodiments, by arranging the shield coil 3 at a position where the Z-direction electromagnetic force is small, the shield bobbin 37 and the supporting structure can be simplified. As a result, the amount of used bobbin materials and supporting members is considerably reduced; thus, the costs of material procurement, machining, and cooling can be reduced, and the weight saving can also be achieved.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A superconductive magnet comprising:
a first group of coils serving as main coils for generating a magnetic field; and
a second group of coils serving as shield coils that are arranged coaxially with the first group of coils and generate a magnetic field whose direction is opposite the direction of a magnetic field generated by the first group of coils so that a magnetic field that leaks outside from the first group of coils is cancelled, wherein
when a center of a region where a magnetic field is generated by the first group of coils is an origin, the second group of coils are arranged along a longitudinal axis of said superconductive magnet, within axis-direction positions unoccupied by the first group of coils, such that a ratio of the axis-direction coordinates of the most distal end of the second group of coils from the origin and the most distal end of the first group of coils from the origin ranges from 0.63 to 0.87.

2. The superconductive magnet according to claim 1, wherein the ratio of axis-direction coordinates of the most distal end of the second group of coils and the most distal end of the first group of coils ranges from 0.73 to 0.87.

3. The superconductive magnet according to claim 1, wherein the ratio of axis-direction coordinates of the most distal end of the second group of coils and the most distal end of the first group of coils ranges from 0.63 to 0.81.

4. The superconductive magnet according to claim 3, wherein the ratio of axis-direction coordinates of the most distal end of the second group of coils and the most distal end of the first group of coils ranges from 0.73 to 0.81.

5. The superconductive magnet according to claim 1, further including:
a first bobbin for holding the first group of coils,
second bobbins for holding the second group of coils, and
a ring- and disc-shaped bobbin supporting member, wherein the ring- and disc-shaped bobbin supporting member couples the first bobbin and the second bobbin.

6. The superconductive magnet according to claim 1, further including:
a first bobbin for holding the first group of coils,
second bobbins for holding the second group of coils, and
a tabular bobbin supporting member, wherein the tabular bobbin supporting member couples the first bobbin and the second bobbin.

7. The superconductive magnet according to claim 1, further including:
a first bobbin for holding the first group of coils,
second bobbins for holding the second group of coils, and
a beam-shaped bobbin supporting member, wherein the beam-shaped bobbin supporting member is coupled with the second bobbin.

8. The superconductive magnet according to claim 1, further including:
a first bobbin for holding the first group of coils,
second bobbins for holding the second group of coils, and
a helium tank that contains the first group of coils and the second group of coils and in which liquid helium is stored, wherein the second bobbin is coupled with a side wall of helium tank that supports the second bobbin.

9. The superconductive magnet according to claim 1, further including:
a first bobbin for holding the first group of coils,
second bobbins for holding the second group of coils, and
a helium tank that contains the first group of coils and the second group of coils and in which liquid helium is stored, wherein the second bobbin is coupled with an outer cylinder of the helium tank, and the outer cylinder of the helium tank supports the second bobbin.

10. The superconductive magnet according to claim 1, including
a first bobbin for holding the first group of coils,
a plurality of second bobbins for holding the second group of coils, and
a bobbin supporting member that extends in a direction orthogonal to the first bobbin and couples the first bobbin with the plurality of second bobbins.

* * * * *